(12) United States Patent
Deibele et al.

(10) Patent No.: US 9,506,953 B2
(45) Date of Patent: Nov. 29, 2016

(54) HIGH SPEED HIGH DYNAMIC RANGE HIGH ACCURACY MEASUREMENT SYSTEM

(71) Applicant: UT-Battelle, LLC, Oak Ridge, TN (US)

(72) Inventors: Craig E. Deibele, Oak Ridge, TN (US); Douglas E. Curry, Oak Ridge, TN (US); Richard W. Dickson, Oak Ridge, TN (US); Zaipeng Xie, Oak Ridge, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 989 days.

(21) Appl. No.: 13/744,123

(22) Filed: Jan. 17, 2013

(65) Prior Publication Data
US 2013/0185009 A1 Jul. 18, 2013

Related U.S. Application Data

(60) Provisional application No. 61/587,812, filed on Jan. 18, 2012.

(51) Int. Cl.
| H04B 17/00 | (2015.01) |
| G01R 19/00 | (2006.01) |
| G06F 17/00 | (2006.01) |

(52) U.S. Cl.
CPC .......... *G01R 19/00* (2013.01); *G01R 19/0092* (2013.01); *G06F 17/00* (2013.01)

(58) Field of Classification Search
CPC ...................................................... G01R 19/00
USPC .................... 455/67.11, 67.14, 226.2; 374/1
See application file for complete search history.

(56) References Cited

U.S. PATENT DOCUMENTS

| 6,237,417 B1 * | 5/2001 | Lonsdale | G01R 27/26 310/313 R |
| 6,280,081 B1 * | 8/2001 | Blau | G01J 1/18 323/316 |
| 2003/0234642 A1 * | 12/2003 | Clegg | G01D 3/10 324/115 |
| 2006/0178157 A1 * | 8/2006 | Gebara | H04B 1/123 455/501 |

* cited by examiner

*Primary Examiner* — Hsin-Chun Liao
(74) *Attorney, Agent, or Firm* — Brinks Gilson & Lione

(57) ABSTRACT

A measuring system includes an input that emulates a bandpass filter with no signal reflections. A directional coupler connected to the input passes the filtered input to electrically isolated measuring circuits. Each of the measuring circuits includes an amplifier that amplifies the signal through logarithmic functions. The output of the measuring system is an accurate high dynamic range measurement.

17 Claims, 2 Drawing Sheets

HIGH SPEED HIGH DYNAMIC RANGE HIGH ACCURACY MEASUREMENT SYSTEM

RELATED APPLICATION

This application claims the benefit of priority of U.S. Provisional Pat. App. No. 61/587,812 filed Jan. 18, 2012 and titled "High Speed High Dynamic Range High Accuracy Measurement System," which is incorporated by reference.

STATEMENT REGARDING FEDERALLY SPONSORED RESEARCH AND DEVELOPMENT

This application was made with United States government support under Contract No. DE-AC05-00OR22725 awarded by the United States Department of Energy. The United States government has certain rights in these inventions.

BACKGROUND

Technical Field

This disclosure relates to measuring a charged particle beam current through a system that renders a high accuracy over a high dynamic range.

Related Art

The current present in a discrete path, such as a conductive path, has both a magnitude and a direction associated with it. A current measurement is a measure of the rate at which charge is moving past a given reference point in a specified direction.

In some discrete paths a current transformer measures the range of current passing past a reference point. The current transformer may produce a reduced current that is proportional to the current flowing through the path. The current transformer is a linear device that does not render dynamic ranges.

DETAILED DESCRIPTION OF THE PREFERRED EMBODIMENTS

The disclosed measuring systems provide large dynamic ranges and accurate measurements. In some applications, the measuring system measure fields such as radio frequency fields. In other applications the measuring system measures energy such as electrical energy or current flow. The measuring system may include multiple flow paths that are cascaded in stages. The stages, also referred to as legs, share or sample a common input (e.g., such as charged beam electrical current) but are electrically isolated from each other. In some applications the output of the cascaded stages may be combined before or after a domain conversion (e.g., analog domain, frequency domain, digital domain, etc.). The combined signal may represent a measurement and in some instances, a direction of the energy flow through a discrete path. The monitoring and measuring of flow through a discrete path may occur without interrupting signal flow.

Figure 1:
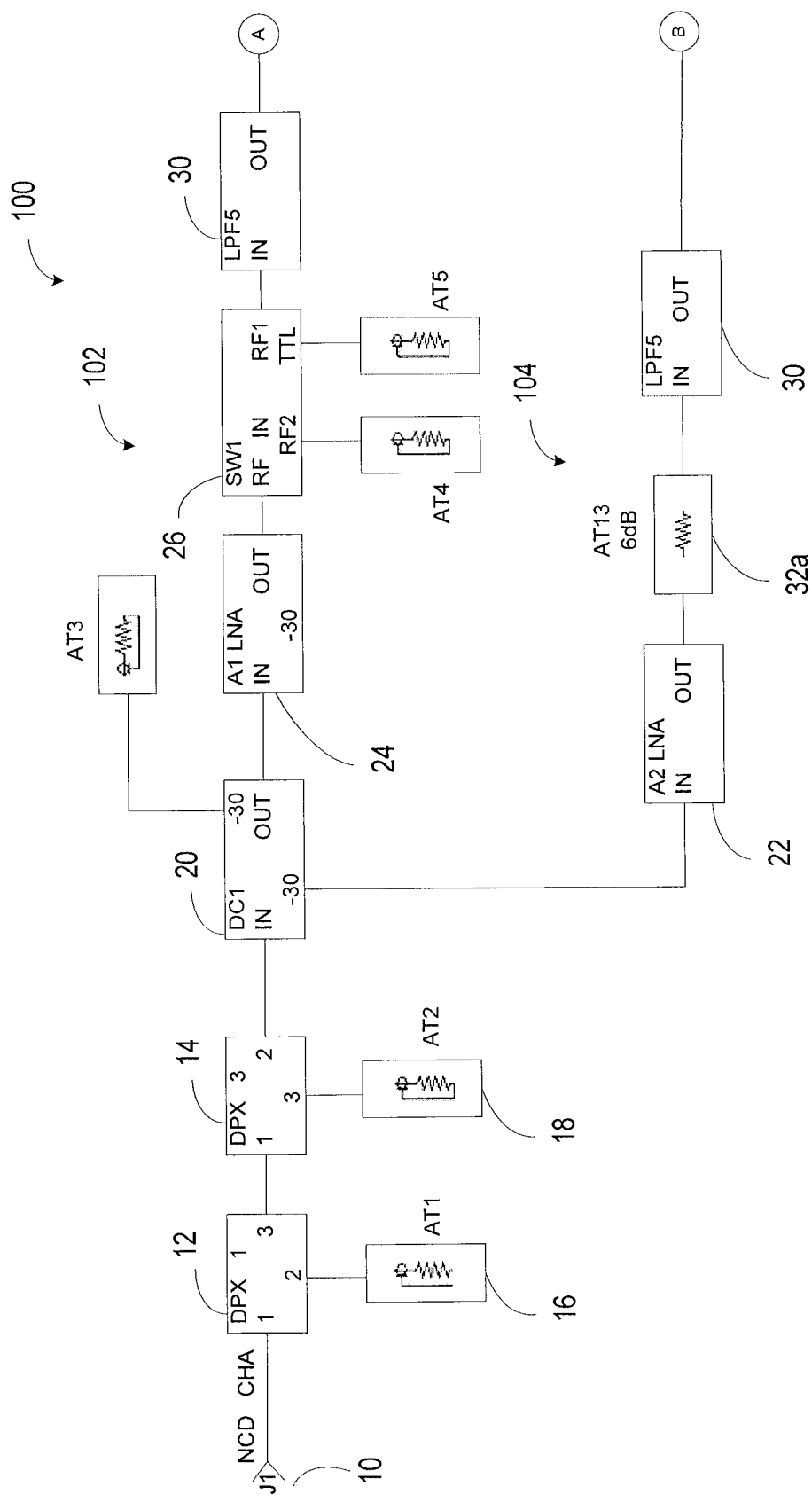
FIG. 1 is a partial block diagram of an exemplary measuring system.
Figure 2:
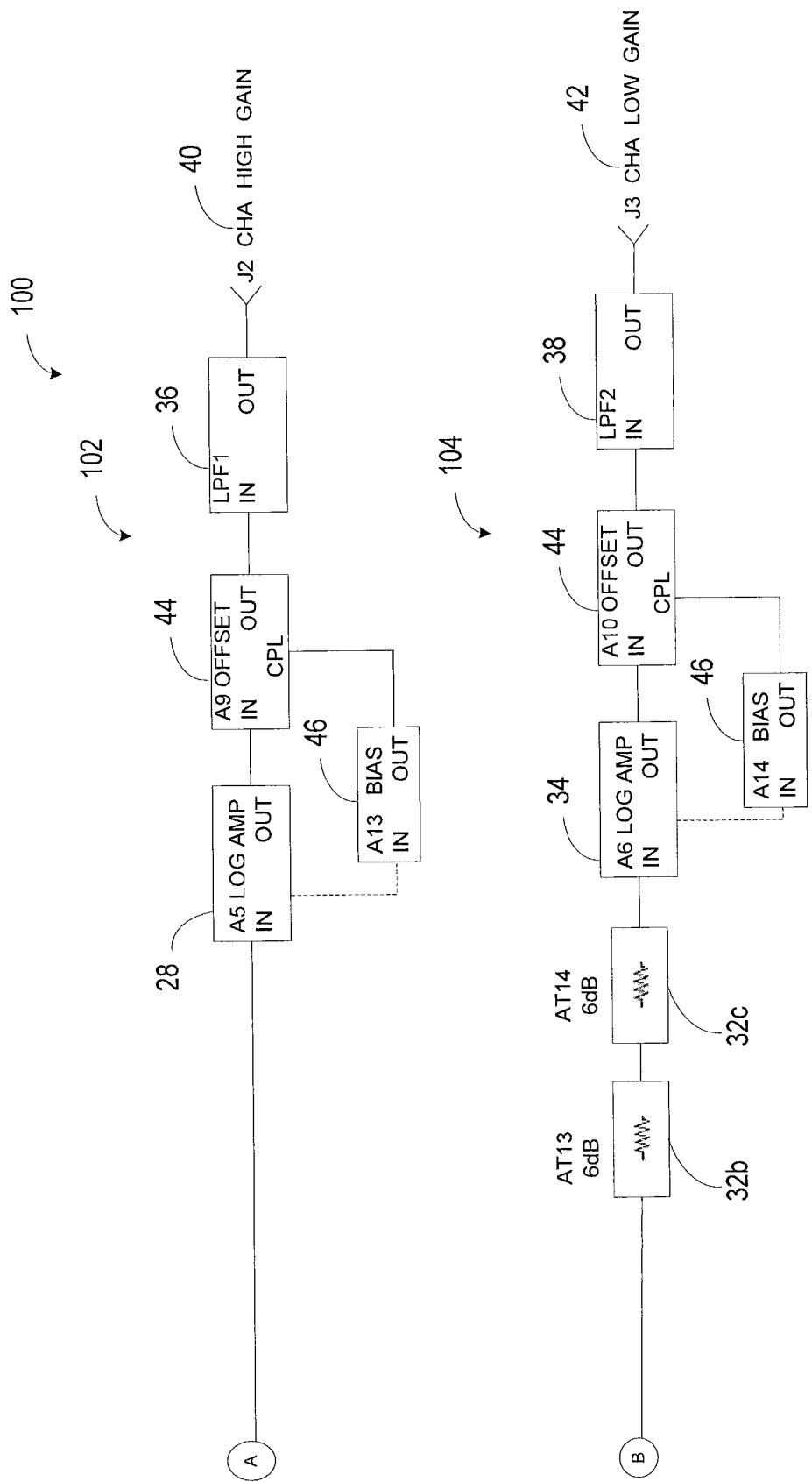
FIG. 2 is a partial block diagram of the exemplary measuring system.

The measuring system 100 shown in FIGS. 1 and 2 accurately measures large dynamic ranges of currents passing through a discrete path. The first and second stages may comprise a high-gain leg 102 and low-gain leg 104 that may be fundamentally identical or functionally similar. The input to these stages may be processed by passive devices that are not used in all disclosed measuring systems. The optional passive device may be configured as a programmable bandpass filter that attenuates baseband and high-band signals. In FIG. 1, a pair of matched diplexers 12 and 14 is configured to process a high frequency pulse train such as a pulse train of about 400 MHz. The first diplexer 12 is configured to filter out frequencies below about 200 MHz and the second diplexer 14 is configured to filter out frequencies above about 600 MHz. The diplexers 12 and 14 emulate or realize a high frequency bandpass filter with little or no signal reflection. Signal reflections may interfere with a dynamic range.

A passive device such as a directional coupler 20 may couple power flowing in one direction to multiple stages of the measuring system 100. In FIG. 1 the directional coupler 20 couples the filtered input signals to the high-gain leg 102 with little or no attenuation and a low-gain leg 104 with a programmable or configured attenuation. The programmable or settable attenuation factor in FIG. 1 reduces the filtered signal by about 30 dB with little or no distortion. In alternative embodiments the settable attenuation factor may be pre-programmed, dynamically programmed (e.g., programmed in real-time), or pre-configured to any level such as a level that renders an attenuation greater than a base level that may comprise about 2 dB, for example.

Low-noise amplifiers 22 and 24 that may be located near the outputs of the directional coupler 20 reduce line losses and boost the signal power of the respective filtered signals. In FIG. 1 the low-noise amplifiers 22 and 24 may have a low noise floor NF (e.g., not greater than about 0.5 dB) and a large gain (e.g., up to about 45 dB) in the operating bandwidth. In some applications, noise is aggressively monitored and filtered to reduce signal fluctuations caused by termination impedance (e.g., thermal noise).

Attenuators 32a, 32b, and 32c in the low-gain leg 104 act as level controllers. Although shown as passive elements, in alternative embodiments, the level controllers may actively monitor and sense signal levels, compare the levels to a desired level, and maintain the signal within a desired operating range. In FIG. 1, an aggregated attenuation is set to a predetermined level; here about 18 dB is applied in the low-gain leg 104 in the form of three 6 dB attenuators 32a, 32b, 32c.

In the high-gain leg 102 a clipper prevents the amplified input from exceeding a predetermined voltage level distorting the signal that is passed through. The clipper may comprise a switch, such as the radio frequency switch 26 shown in FIG. 1 that removes portions of the signals that exceed a predetermined voltage level such as at about a five volt level, for example. To block undesired harmonics arising from the clipper in the high-gain leg 102 and those that might pass through the low-gain leg 104, lowpass filters allows frequencies below a specified frequency to pass through. The lowpass filters 30 in the high-gain leg 102 and the low-gain leg 104 in FIG. 1 have a cut-off frequency at about 600 MHz.

Electronic amplifiers in the high-gain leg 102 and the low-gain leg 104 amplify the signals proportional to the logarithm of their respective inputs. The log amplifiers 28 and 34 of FIG. 1 have an output voltage equivalent to a predetermined amplification factor or multiplication product of a programmable constant times the natural log of the input voltage. In FIG. 1, the log amplifiers 28 and 34 may have a fast rise time (e.g., less than about 10 Nano seconds) and a large dynamic range (e.g., a range of about 60 dB).

When the electronic amplifiers in the high-gain leg 102 and the low-gain leg 104 output only a positive voltage, an optional offset circuit 44 may convert the signal to a bipolar level. A biasing circuit 46 may establish the offset level in the analog domain. In other embodiments algorithms that monitor rapid changes in steady state, signal characteristics, or are based on circuit characteristics may offset the input to ensure the output signal is within a bipolar range. In FIG. 1, the pre-set offset level may be a function of the respective log amplifiers 28 and 34. The output of the offset circuits 44 are passed through antialiasing filters, shown as lowpass filters 36 and 38 before the J2 CHA High Gain 40 and J3 CHA Low Gain 42 signals are processed by an analog-to-digital converters (ADCs, not shown) in each of the high-gain leg 102 and the low-gain leg 104.

The output of the respective ADCs may be further processed through a logic scaling process or function programmed in a memory or a database server or machine. The scaling values are correlated to the ADC output signal counts rendered by the respective ADCs. That is, a look-up table stored in memory accessible to a controller in continuity with the high-gain leg 102 and the low-gain leg 104 render value representing the amount of current flowing through each leg 102 and 104. In some systems a multi-dithering adaptive controller processes all of the current values quantified through each of the legs 102 and 104 to render an electrical current amplitude measurement.

In some systems a multi-dithering adaptive controller identifies transition regions in which each of the high-gain 102 and low-gain 104 stage counts that are designated viable (e.g., measured values in each leg are considered viable) and and/or non-linearly blends the counts to derive a measured value. To minimize the effects of noise introduced by circuit elements such as the ADCs a weighted averaging may also be applied by the multi-dithering adaptive controller to minimize the effects of noise.

While the disclosed measuring systems shown in FIGS. 1 and 2 describe a system that measures large dynamic ranges of current, other systems may measure fields such as radio frequency fields. In those systems optional diplexers 12 and 14 that may emulate or realize a bandpass filter are not used. In some systems, the offset circuits 44 and biasing circuits 46 are not used, such as when the log amplifiers 28 and 34 produce bipolar outputs. In other alternative systems three stages, four stages, five stages, and any number of stages or legs are cascaded to process a common input to render an even greater dynamic range. The additional stages or legs may render greater granularity and dynamic range by mirroring the circuits in one or all of the other stages or legs or by implementing different processes or circuits. In some systems each of the output of the stages or legs may be processed or combined before or after a domain conversion (e.g., analog domain, frequency domain, digital domain, etc.). The combined signal may represent a measurement that in some instances is a level of energy flowing through or near a reference point.

In another alternative system the multi-dithering adaptive controller may be implemented in signal processing software, like the filters, diplexers, amplifiers, directional couplers, clippers, etc. The software may be encoded in a non-transitory signal bearing medium, or may reside in a memory resident to or interfaced to one or more processors or controllers that may support a tangible communication interface, wireless communication interface, or a wireless system. The memory may retain an ordered listing of executable instructions for implementing logical functions and may retain one or more database engines that access files composed of records, each of which contains fields, together with a set of operations for searching, sorting, recombining, and/or other functions that are also retained in memory. A logical function may be implemented through digital circuitry, through source code, or through analog circuitry. The software may be embodied in any non-transitory computer-readable medium or signal-bearing medium, for use by, or in connection with an instruction executable system, apparatus, and device, resident to system that may maintain a persistent or non-persistent connection with a destination. Such a system may include a computer-based system, a processor-containing system, or another system that includes an input and output interface that may communicate with a publicly accessible distributed network and/or privately accessible distributed network through a wireless or tangible communication bus through a public and/or proprietary protocol.

A "computer-readable medium," "machine-readable medium," "propagated-signal" medium, and/or "signal-bearing medium" may comprise a non-transitory medium that contains, stores, communicates, propagates, or transports software for use by or in connection with an instruction executable system, apparatus, or device. The machine-readable medium may selectively be, but not limited to, an electronic, magnetic, optical, electromagnetic, infrared, or semiconductor system, apparatus, device, or propagation medium. A non-exhaustive list of examples of a machine-readable medium would include: an electrical connection having one or more wires, a portable magnetic or optical disk, a volatile memory such as a Random Access Memory (RAM), a Read-Only Memory (ROM), an Erasable Programmable Read-Only Memory (EPROM or Flash memory), or an optical fiber. A machine-readable medium may also include a tangible medium upon which software is printed, as the software may be electronically stored as an image or in another format (e.g., through an optical scan), then compiled, and/or interpreted or otherwise processed. The processed medium may then be stored in a computer and/or machine memory.

The term "coupled" disclosed in this description may encompass both direct and indirect coupling. Thus, first and second parts are said to be coupled together when they directly contact one another, as well as when the first part couples to an intermediate part which couples either directly or via one or more additional intermediate parts to the second part. The term "substantially" or "about" may encompass a range that is largely, but not necessarily wholly, that which is specified. It encompasses all but a significant amount. When devices are responsive to commands events, and/or requests, the actions and/or steps of the devices, such as the operations that devices are performing, necessarily occur as a direct or indirect result of the preceding commands, events, actions, and/or requests. In other words, the operations occur as a result of the preceding operations. A device that is responsive to another requires more than an action (i.e., the device's response to) merely follow another action.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

What is claimed is:

1. A measuring system comprising:
a passive device configured to emulate a bandpass filter with substantially no reflections and receive a charged beam electrical current; and
a directional coupler coupled to the passive device that couples the charged beam electrical current passing through an input of the directional coupler to a plurality of measuring circuits;
where each of the measuring circuits includes an amplifier that multiples the charged beam electrical current to logarithm of the charged beam electrical current's amplitude.

2. The measuring system of claim 1 where the passive device comprises a pair of matched diplexers.

3. The measuring system of claim 2 where a passband of the bandpass filter comprises a frequency range of about 400 MHz.

4. The measuring system of claim 1 where the passive device is configured to process input signals of at least 400 MHz.

5. The measuring system of claim 1 where the directional coupler couples the charged beam electrical current to a first measuring circuit with substantially no attenuation and to a second measuring circuit at a programmable attenuation level.

6. The measuring system of claim 5 where the level is greater than about 2 dB.

7. The measuring system of claim 1 where at least one of the measuring circuits comprises a level controller that maintains the charged beam electrical current within an operating range.

8. The measuring system of claim 1 where at least one of the measuring circuits includes a clipper device.

9. The measuring system of claim 8 where the clipper device and the level controller are not part of the same measuring circuits.

10. The measuring system of claim 1 where each of the measuring circuits comprise analog-to-digital devices.

11. The measuring system of claim 1 where each of the measuring circuits feed a multi-dithering controller that renders an electrical current measurement.

12. The measuring system of claim 11 where multi-dithering controller derives the electrical current measurement by blending and averaging analog-to-digital counts.

13. A measuring system comprising:
a first and a second diplexer coupled in series and configured to emulate a broadband matched bandpass filter; and
a directional coupler coupled to the second diplexer that couples the signal passing through an input of the directional coupler to a high-gain measuring stage and a low-gain measuring stage;
where each of the measuring stages includes a log amplifier that amplifies the amplitude of the signal passing through the input.

14. The measuring system of claim 13 where the directional coupler couples the signal passing through the input of the directional coupler to the high-gain measuring stage with substantially no attenuation and to the low-gain measuring stage at a programmable attenuation level.

15. The measuring system of claim 14 where the level is greater than about 2 dB.

16. The measuring system of claim 13 where the low-gain measuring stage comprises a level controller that maintains the processed signal at an operating range.

17. The measuring system of claim 13 where high-gain measuring stage comprises a clipper device.

* * * * *